(12) United States Patent
Hutchison et al.

(10) Patent No.: US 6,359,791 B1
(45) Date of Patent: Mar. 19, 2002

(54) HIGH DENSITY TELECOMMUNICATIONS ENCLOSURE AND MOUNTING ASSEMBLY

(75) Inventors: Randall D. Hutchison, Shawnee; Robert Schiffbauer, Olathe; Kevan Smith, Overland Park, all of KS (US)

(73) Assignee: Special Product Company, Overland Park, KS (US)

( * ) Notice: Subject to any disclaimer, the term of this patent is extended or adjusted under 35 U.S.C. 154(b) by 0 days.

(21) Appl. No.: 09/532,426

(22) Filed: Mar. 23, 2000

(51) Int. Cl.$^7$ .............................. H05K 7/02; H05K 7/04
(52) U.S. Cl. ....................... 361/807; 361/810; 361/825; 379/325; 379/328
(58) Field of Search .................... 361/807, 809, 361/825, 810; 248/220.21, 220.22, 221.11, 231.91, 247, 262, 268, 916; 379/325, 328; 211/41.17

(56) References Cited

U.S. PATENT DOCUMENTS

| | | | | |
|---|---|---|---|---|
| 4,097,012 A | * | 6/1978 | McIntyre | 248/23 |
| 4,149,694 A | * | 4/1979 | Verini | 248/539 |
| 4,971,281 A | * | 11/1990 | Steinbeck | 248/225.2 |
| 5,836,791 A | * | 11/1998 | Waas et al. | 439/709 |
| 6,040,557 A | * | 3/2000 | Prust et al. | 219/206 |
| 6,292,556 B1 | | 9/2001 | Laetsch | 361/690 |

* cited by examiner

*Primary Examiner*—Jeffrey Gaffin
*Assistant Examiner*—Hung Bui
(74) *Attorney, Agent, or Firm*—Hovey, Williams, Timmons & Collins

(57) ABSTRACT

A telecommunications equipment mounting assembly is provided including a plate (12) presenting a plurality of separate, spaced apart mounting zones (24), together with generally U-shaped brackets (14) respectively secured to the plate (12) adjacent corresponding zones (24). A telecommunications equipment enclosure (16) is secured to each pair of bracket legs whereby the enclosures (16) are spaced from the plate (12). Preferably, the brackets are oriented at an oblique angle relative to the longitudinal axis of the plate (12) to facilitate cabling and interconnection of the electrical equipment within the enclosures (16). In alternate forms, a standoff leg assembly (56) is employed to secure the mounting plates (12) and associated hardware to an upright wall (62). This creates a cableway (80) between the plates (12) and the wall (62).

4 Claims, 3 Drawing Sheets

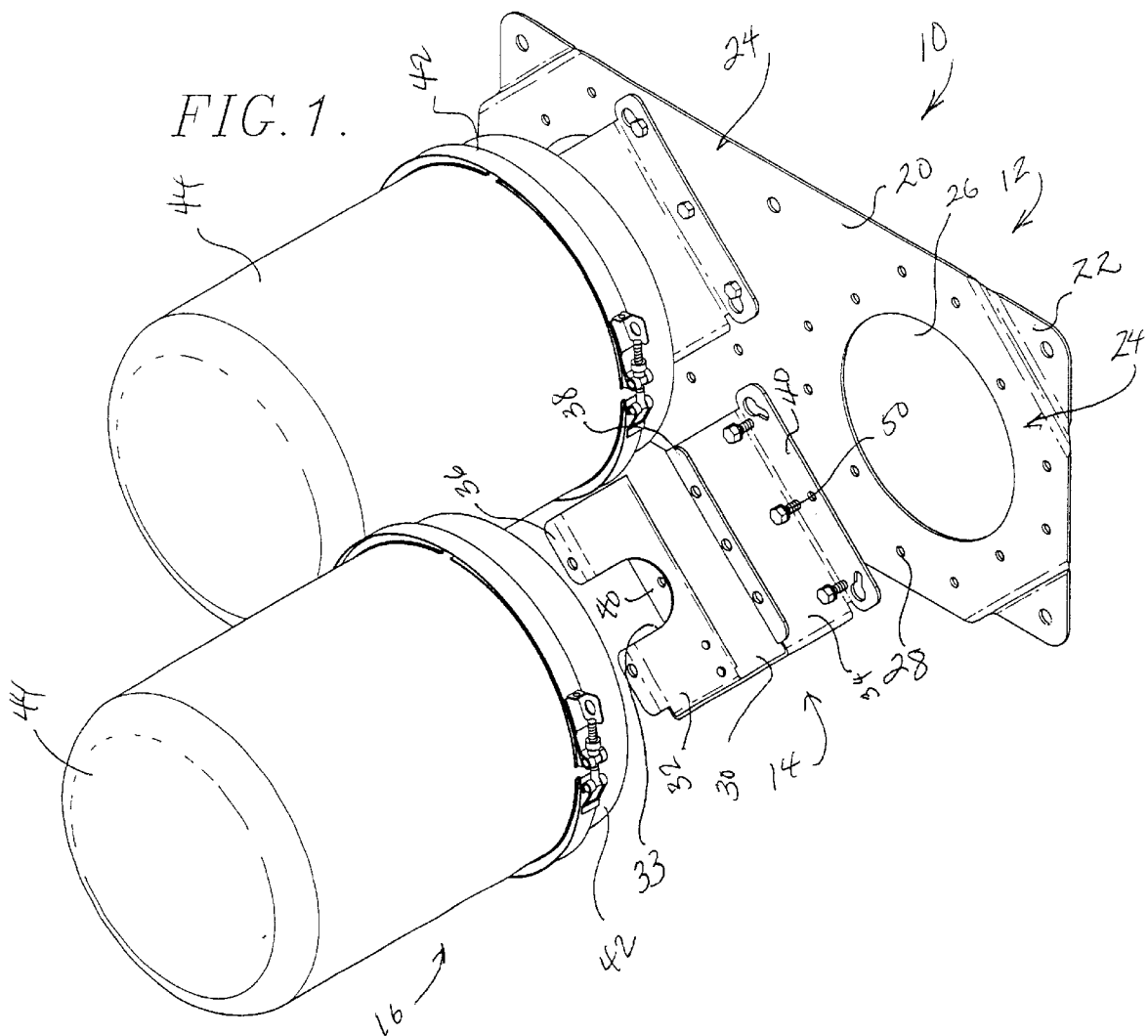
FIG. 1.
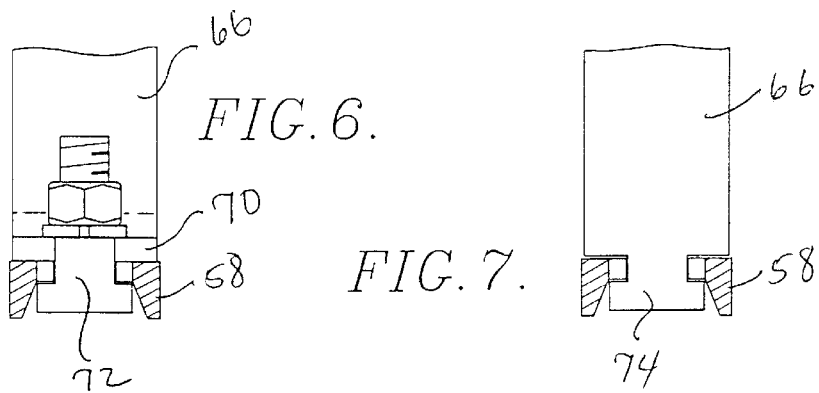
FIG. 6.
FIG. 7.

HIGH DENSITY TELECOMMUNICATIONS ENCLOSURE AND MOUNTING ASSEMBLY

BACKGROUND OF THE INVENTION

1. Field of the Invention

The present invention is broadly concerned with mounting assemblies for telecommunication equipment enclosures which permits convenient mounting of such enclosures within restricted areas such as manholes. More particularly, the invention pertains to such mounting assemblies made up of a mounting plate permitting attachment of plural enclosures thereto by way of U-shaped brackets. The brackets are oriented obliquely relative to the mounting plate so as to facilitate cabling of the equipment enclosures. In preferred forms, a standoff leg assembly can be included which permits the mounting plates to be secured to an upright wall while defining a cableway between the plates and the wall surface.

2. Description of the Prior Art

The ever-increasing use of the internet, wide area networks and other telecommunication innovations has increased the demand for high-speed, high-bandwidth digital telecommunications services such as Integrated Services Digital Network (ISDN), Digital Subscriber Line (DSL), and First Level Digitally Multiplexed Telecommunications Carrier System (T1) services in homes and businesses. Because of signal propagation limitations, these digital services require the use of repeaters to repeat signals if end users are too far from the provider's central office. These repeaters are typically housed in protective enclosures that are mounted to telephone poles or more importantly in manholes.

Given the proliferation of repeater and doubler enclosures and other types of telecommunications equipment designed for location in manholes, a problem has arisen in effectively mounting this equipment. In this respect, the manholes are often rectangular subterranean enclosures where telecommunications cabling extends from one end wall, along the sidewalls of the enclosure and out the opposite end wall. To be effective, the mounting and interconnection of the repeater and doubler or other equipment must not unduly restrict access to the equipment and cabling. Therefore, it is sometimes necessary to mount the equipment on the manhole end wall or, if no space is available there, along the sidewalls thereof. In the case of sidewall mounting, this must be done in a way to avoid disturbing other pass-through cabling extending along the manhole sidewalls.

There is accordingly a need in the art for improved mounting arrangements for telecommunications equipment which permits ready mounting in a variety of locations and orientations while preserving manhole space and normal cabling runs through the manhole.

SUMMARY OF THE INVENTION

The present invention overcomes the problems outlined above and provides a mounting plate combination including a mounting plate adapted for support of a plurality of equipment enclosures at spaced mounting zones thereon, together with specialized, generally U-shaped brackets secured to the plate and supporting corresponding equipment enclosures. Each bracket includes a bight adjacent the mounting plate, with a pair of outwardly extending, spaced apart legs; an enclosure is secured by fasteners to each pair of bracket legs. Equipment enclosures of this type are more fully described in pending U.S. patent application Ser. No. 09/434,235 filed Nov. 5, 1999, incorporated by reference herein.

Preferably, the plate is of elongated, somewhat rectangular configuration and presents a longitudinal axis. The bracket legs are also elongated and define respective axes. In use, the bracket leg longitudinal axes are oriented at an oblique angle (typically from abut 20–60°) relative to the plate axis. In this fashion, the individual equipment enclosures can be more readily interconnected via cabling into the telecommunications system.

Where sidewall mounting is desired, use can be made of a standoff leg assembly secured to the mounting plate and permitting attachment thereof to an upright wall surface in spaced relationship thereto to define a cableway between the wall and the mounting plate. In this fashion, a cableway is defined so that other cabling is not disturbed by the mounting assembly.

BRIEF DESCRIPTION OF THE DRAWINGS

FIG. 1 is a perspective exploded view of a mounting plate assembly in accordance with the invention, depicting the construction of the mounting plate, brackets telecommunications equipment enclosures;

FIG. 3 is a top view of the combination shown in FIG. 2, illustrating the mounting plate being secured to a wall or the like;

FIG. 6 is an enlarged fragmentary view illustrating one of the standoff leg connections to an associated base member; and FIG. 7 is another enlarged, fragmentary view depicting another standoff leg connection to an associated base member.

DETAILED DESCRIPTION OF THE PREFERRED EMBODIMENT

Figure 3:
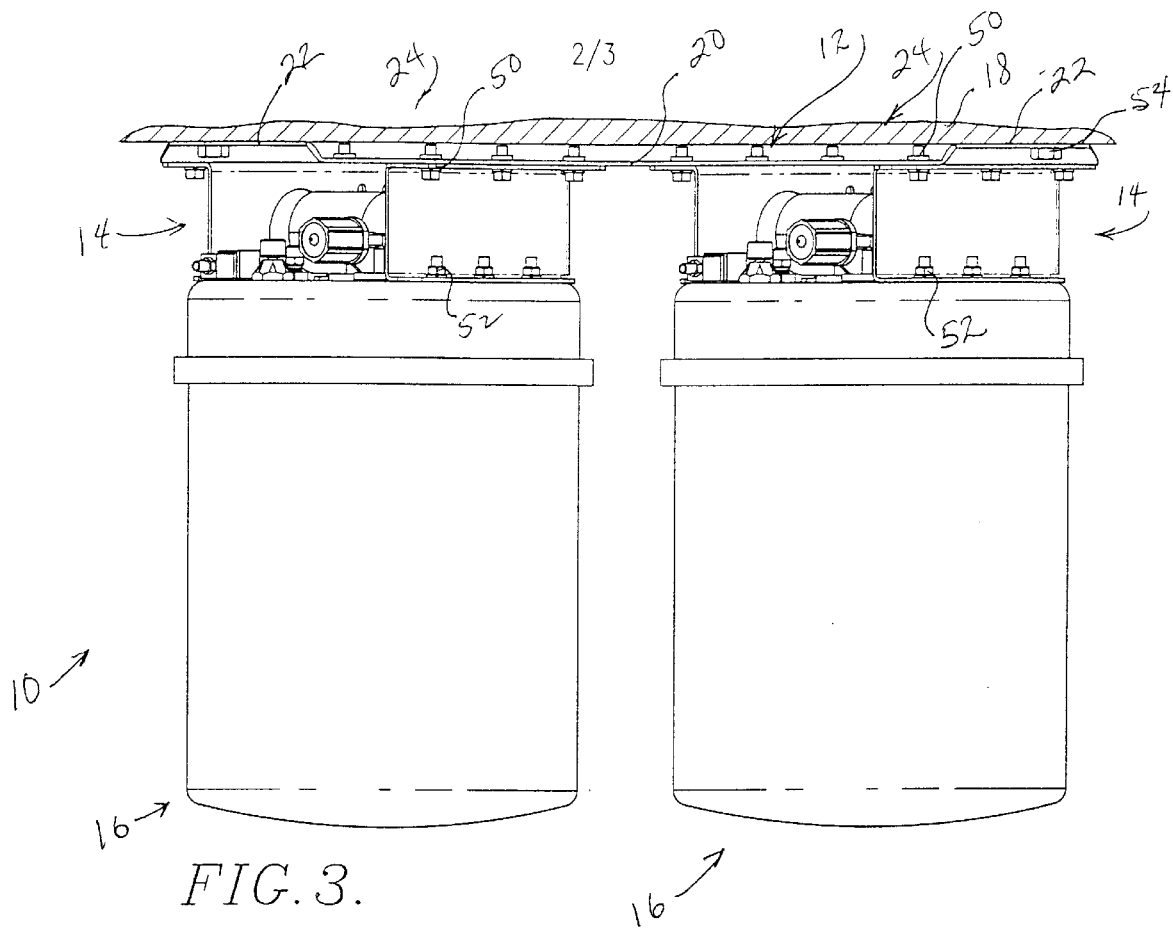
Figure 2:
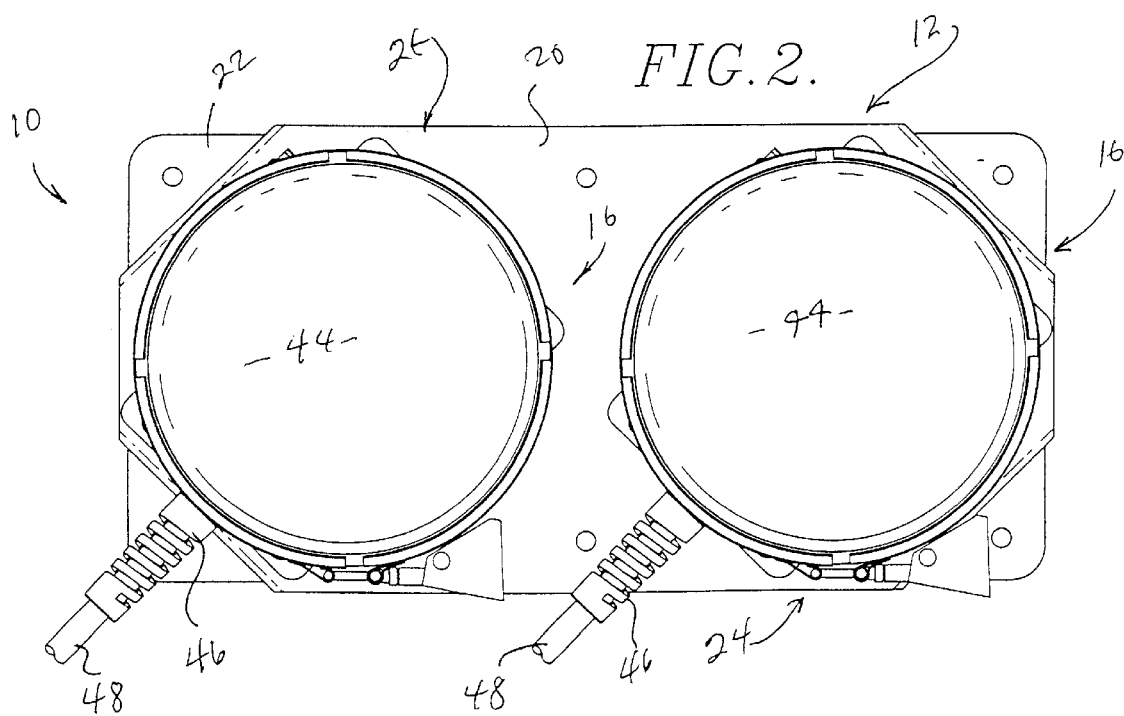
FIG. 2 is a front view of a complete mounting plate, bracket and enclosure combination.

Turning now to the drawings, and particularly FIGS. 1–3, a mounting plate, bracket and equipment enclosure combination 10 is illustrated. Broadly speaking, the combination 10 includes a specialized mounting plate 12, a plurality of generally U-shaped brackets 14 and telecommunications equipment enclosures 16. As shown, the plate 12 is designed for attachment to a wall 18 or the like with the brackets 14 secured to the plate while the enclosures 16 are secured to the brackets in spaced relationship from the plate.

In more detail, the mounting plate 12 is formed of metal and has a generally planar, major mounting portion 20 as well as offset, apertured securement ears 22 at the corners thereof. As shown, the plate 12 is of generally rectangular configuration and presents a longitudinal axis. The major portion 20 of the plate 12 has a pair of spaced apart, side-by-side mounting zones 24. Each such zone 24 is defined by a large central opening 26 as well as a series of fastener-receiving holes 28 strategically arrayed about the opening 26.

Each bracket 14 includes a central bight 30 as well as a pair of outwardly extending, laterally spaced apart legs 32, 34. These legs are essentially identical except that the leg 32 has a central recess 33 for cable egress from the enclosure.

Each leg at its outer end includes an out turned, flattened lip 36, 38 as best seen in FIG. 1. Similarly, an outwardly extending, apertured flange 40 is provided at the base of each leg 32, 34.

The enclosures 16 are conventional and include a base 42 as well as a generally tubular, close-ended main body 44. Each enclosure houses telecommunications equipment, e.g., a plurality of repeater cards. Each enclosure further is provided with a cable attachment 46 so as to permit attachment thereof via a telecommunication cable 48 (see FIG. 2). The design and construction of enclosures of this type is further explained in the aforementioned, incorporated by reference patent application.

As best seen in FIG. 3, the brackets 14 are secured to the major portion 20 of the plate 12 in substantial alignment with each zone 24. Specifically, an associated bracket 14 is fastened to each zone by way of threaded fasteners 50. As illustrated in FIGS. 2–3, the brackets 14 are mounted obliquely relative to the longitudinal axis of the plate 12. In particular, each of the bracket legs 32, 34 is of elongated configuration and thus has a longitudinal axis. The longitudinal axes of the bracket legs are oriented relative to the longitudinal axis of the plate 12 at an angle of from about 20–60°, more preferably about 45°. Such angular mounting of the brackets 14 allows easier cabling of the enclosures 16.

Each of the enclosures 16 is secured to an associated bracket 14. Specifically, threaded studs 52 welded to the bottom of the enclosure are used which extend through the leg lip apertures and are fastened with threaded nuts.

The combination 10 can readily be mounted on wall 18 through the use of screws 54 or the like passing through the apertures provided in ears 22. This attachment is best illustrated in FIG. 3, where it will be observed that the offset between the ears 22 and the major plate portion 20 allows room for the ends of fastener 50 beneath the plate 12 without interfering with the connection of the plate to the wall 18.

Figure 5:
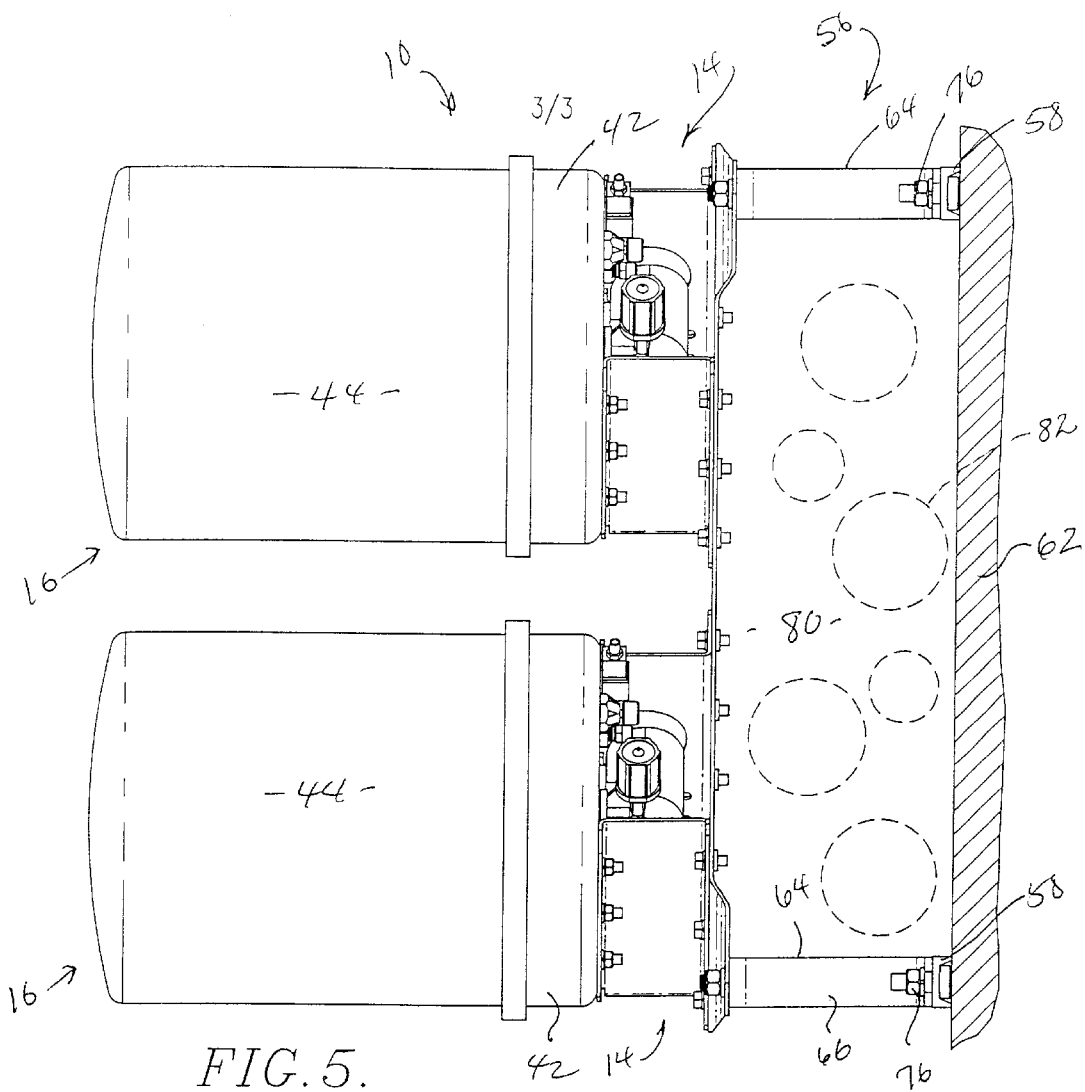
FIG. 5 is a side view of a mounting plate, bracket and enclosure combination secured to a vertical wall via a standoff leg assembly, showing the cableway defined between the wall surface and the mounting plate.
Figure 4:
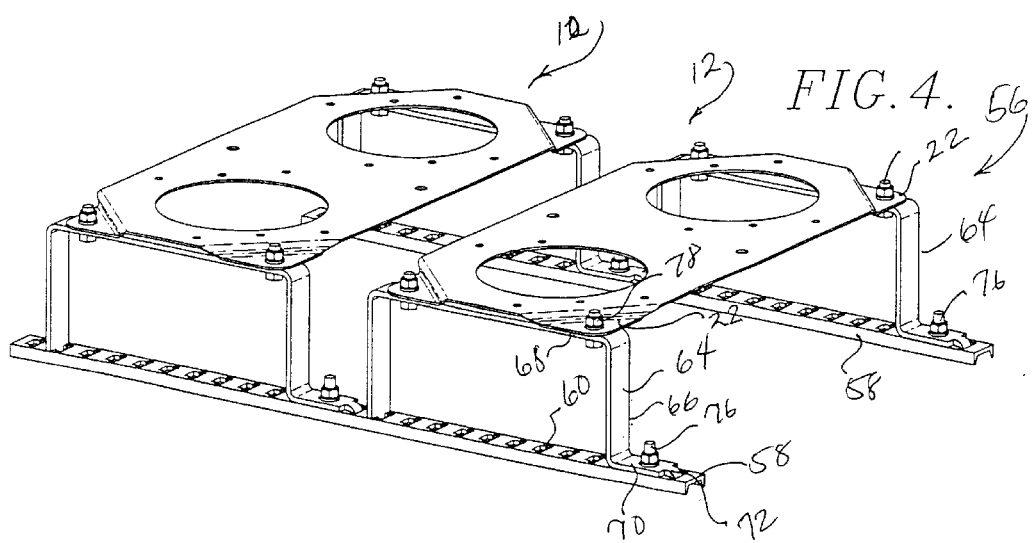
FIG. 4 is a perspective view illustrating a pair of the mounting plates of the invention, supported on a standoff leg assembly.

In further preferred forms of the invention, the combination 10 is secured to an upright wall surface or the like by means of a standoff leg assembly 56 (see FIGS. 4–5). The assembly 56 includes a pair of elongated, generally U-shaped base members 58 provided with a series of rectangular attachment openings 60 regularly spaced along the length thereof. These base members are designed to be secured to an upright wall 62 by any convenient means, typically screws or the like. The overall assembly 56 further includes metallic standoff legs 64 adapted for connection to the base members 58 and the plates 12 of the combination 10. Each standoff leg includes a web section 66 with an outermost, in-turned apertured lip 68 as well as an inboard foot section 70. The inboard foot section has a pair of inwardly extending, generally T-shaped connectors 72, 74 adjacent the opposed ends thereof (see FIGS. 6–7).

The standoff assembly 56 is constructed by securing two pairs of standoff legs 64 to each base member 58. This is done by inserting the connectors 72, 74 of each foot section into a pair of base openings 60, followed by attachment via a threaded fastener 76. When the legs of each pair are so attached, a mounting plate 12 is placed in spanning relationship between the base members 58 as shown in FIG. 4, and fasteners 78 are used to attach the lips 68 of the legs to the apertured ears 22 of the plate. Of course, the overall combination 10 is completed by securement of the brackets 14 and enclosures 16 to the plates 12, in the manner previously described.

The use of the standoff leg assembly 56 permits the combination 10 to be secured to wall 62 while defining therebetween a convenient cableway 80. A plurality of telecommunication cables 82 are depicted in phantom in FIG. 5, passing through the cableway 80.

We claim:

1. A mounting assembly comprising:

a mounting plate including a plurality of separate, spaced apart mounting zones;

a number of brackets, each being of generally U-shaped configuration and presenting a bight and a pair of spaced apart legs secured to one of said mounting zones along a first flank of each leg; and a telecommunications equipment enclosure secured to a second flank of each pair of said bracket legs whereby the enclosures are spaced from said plate by the width of said legs.

2. The mounting assembly of claim 1, said plate being of elongated configuration and presenting a longitudinal axis within a plane, said bracket legs also being elongated and defining longitudinal axes parallel to said plane, said bracket leg longitudinal axes being oriented at an oblique angle relative to said plate longitudinal axis.

3. The mounting assembly of claim 1, there being a pair of said mounting zones.

4. The mounting assembly of claim 1, including a standoff leg assembly secured to said plate and permitting attachment thereof to a wall or another similar support structure in spaced relationship to the wall and to define a cableway between the wall and mounting plate.

* * * * *